United States Patent [19]

Nakanuma

[11] Patent Number: 5,434,564
[45] Date of Patent: Jul. 18, 1995

[54] METHOD AND APPARATUS FOR PRODUCING PULSES CORRESPONDING IN NUMBER TO THE AMOUNT OF CHANGES IN A PHYSICAL QUANTITY

[75] Inventor: Tadashi Nakanuma, Shiga, Japan

[73] Assignee: Koga Electronics Co., Ltd., Shiga, Japan

[21] Appl. No.: 767,822

[22] Filed: Sep. 30, 1991

[51] Int. Cl.⁶ .............................................. H04Q 9/00
[52] U.S. Cl. .............................. 340/870.19; 341/123; 327/100
[58] Field of Search ............ 340/870.19, 870.16, 340/870.17; 328/150, 151; 307/352, 353, 308; 324/142, 103 R, 115; 341/122, 123, 124, 125, 131, 157, 158, 164, 165; 327/91, 94, 95, 100, 365

[56] References Cited

U.S. PATENT DOCUMENTS

| | | |
|---|---|---|
| 3,753,133 | 8/1973 | Shumate, Jr. ............... 341/123 |
| 4,007,357 | 2/1977 | Yanagishima . |
| 4,158,195 | 6/1979 | Abe ............................ 340/870.19 |
| 4,194,180 | 3/1980 | Noren et al. ............... 340/870.19 |
| 4,297,680 | 10/1981 | Koeman ...................... 341/123 |
| 4,363,976 | 12/1982 | Minor .......................... 307/353 |
| 4,370,643 | 1/1983 | Kitamura ..................... 378/151 |
| 4,390,844 | 6/1983 | Ting ............................. 328/151 |
| 4,393,371 | 7/1983 | Morgan-Smith ............ 341/123 |
| 4,897,647 | 1/1990 | Sakamoto et al. ......... 340/870.19 |

FOREIGN PATENT DOCUMENTS 0211477  5/1986  European Pat. Off. .

OTHER PUBLICATIONS

Owen, "PCM and Digital Transmission Systems", 1982, McGraw Hill, USA, pp. 87–89.

Primary Examiner—John K. Peng
Assistant Examiner—Andrew Hill
Attorney, Agent, or Firm—Banner & Allegretti, Ltd.

[57] ABSTRACT

Pulses are produced in accordance with physical quantity changes in order to express the amount of change by count of the pulses produced. The changes are input to a convertor which converts them to corresponding electrical output values which are made available to a sample and hold circuit and to a first input of a comparator. An output value accepted from the convertor is held, as a held value, in the sample and hold circuit and provided therefrom to a second input of the comparator. The comparator produces an output pulse, so as ultimately to provide a trigger pulse and to be counted, only when the first input of the comparator differs from the second input thereof by a preset reference amount. At each trigger pulse, the sample and hold circuit accepts the next available electrical output value from the convertor as the value to be hold and provided to the comparator. In a preferred embodiment involving the movement of an instrument over a long distance to reach an objective point, it is possible to freely change the reference amount and, thus, the pulse density, or resolution, during use of the instrument. In so doing, movement over most of the distance is effected with the pulse density set at a high value to improve speed of movement and, as the objective point is nearly attained, the pulse density is reduced and the instrument finally locates the objective point with a low pulse density to improve the smoothness of movement.

20 Claims, 13 Drawing Sheets

METHOD AND APPARATUS FOR PRODUCING PULSES CORRESPONDING IN NUMBER TO THE AMOUNT OF CHANGES IN A PHYSICAL QUANTITY

BACKGROUND OF THE INVENTION

This invention relates to a technique of producing electric pulses in accordance with the change of various physical quantities such as the position of a linearly or curvilinearly moving object or the angle of rotation of a rotary object. More particularly, the invention relates to a method and apparatus for producing a series of pulses in proportion to the change of a physical quantity, so that by counting the number of pulses it is possible to know the amount of change of the physical quantity.

There is known an instrument called an encoder for producing electric pulses in accordance with the change of the position or rotational angle of an object. There are two types of encoders, one of which is a rotary type while the other is a linear type. The former produces pulses in accordance with the change of rotational angle while the latter produces pulses in accordance with linear displacement, and both are graduated at regular intervals in the directions of rotation and linear displacement, respectively, so that electric pulses corresponding to the number of the graduation marks that have been passed upon rotation or displacement are produced.

Graduation is made in various ways, such as mechanical, optical or magnetic ways. In the prior art the graduation marks are at fixed, regular intervals. In order that the systems or instruments which employ encoders may operate stably, it is necessary that the graduation should be fixed. In rotary type encoders the number of graduation marks per revolution must be an integer to ensure continuity over a range of more than 360°.

The conventional encoders have the following disadvantages.

(1) In the conventional encoders the number of pulses produced per revolution or upon travel of a unit distance (which will be referred to as the pulse density or resolution hereinafter) is determined when the instruments are manufactured and cannot be changed later. Although quick operation is possible with an encoder having a high pulse density, it is difficult to make final positioning due to too quick motion, with a possibility of overshooting or a danger of collision of mechanical parts or elements. Although it is easy with an encoder having a low pulse density to locate a desired point, it takes a long time for the instrument to travel a long distance, or a desired travel cannot be completed by a single operation, with resulting reduction of the operability of the instrument. In practice, therefore, the pulse density of an encoder is set to a medium value in accordance with its use. However, since the pulse density is fixed, the operability of the instrument cannot be improved.

(2) To eliminate the above defect, there have been proposed several methods.

a) One of the methods is to use an electronic circuit to multiply the number of pulses by an integer so as to increase the apparent pulse density. However, the resulting pulse train lacks continuity, that is, even when the encoder is moved smoothly, the multiplied pulses are not produced evenly, but some of them are aggregated, so that a machine controlled by the pulses will move jerkily or vibration is likely to occur.

b) Another method is to divide the pulses by an integer to reduce the pulse density. This method also requires an electronic circuit for dividing pulses with resulting increase in the manufacturing cost of the encoder.

(3) Since the graduation of the known encoders is fixed, chattering is likely to occur in their operation to produce error pulses, which result in erroneous operation of the whole system in which the encoder is incorporated.

SUMMARY OF THE INVENTION

In accordance with the invention, the amount of change of a physical quantity, such as position or angle is converted to a corresponding electrical quantity, say, voltage (an analog quantity), and each time the electrical quantity increases or decreases by a predetermined reference or unit amount, one electric pulse is produced, so that it is possible to express the amount of change of the physical quantity by the number of the electric pulses that have been produced.

FIG. 2 shows a graph in which the output 6 of a physical-quantity-to-voltage converter is plotted, with displacement as a physical quantity being treated taken along the abscissa and voltage taken along the ordinate. Each time the output increases or decreases by a predetermined reference amount R, one pulse 9 is produced, so that the amount of increase or decrease of the displacement can be expressed by the number of the pulses 9 that have been produced. By changing the magnitude of the reference amount R it is possible to change the number of pulses 9 for a unit amount of change of the physical quantity (that is, the pulse density or resolution).

This invention provides a method of producing electric pulses in accordance with the change of a physical quantity being dealt with, wherein each time an electric pulse is produced, the value of the physical quantity is sampled and held; and each time the physical quantity has changed, and caused a corresponding output change by a predetermined reference amount R, with respect to the sampled and held value thereof, one output electric pulse is produced to cause the sampled and held value to be replaced by the value of the physical quantity at that time; and the above operations are repeated to produce a series of output pulses whose number corresponds to the amount of change of the physical quantity. By counting the number of the output pulses it is possible to know the amount of change, and by changing the reference amount R it is possible to change the interval or density of the output pulses thereby to change the resolution. The physical quantity may either increase or decrease.

The systems of the invention have the following four basic constructions.

(1) The system of the first construction comprises:

a) converting means for converting a physical quantity to a corresponding output electrical quantity;

b) sample and hold means for sampling and holding the value of said output electrical quantity each time said output electrical quantity has changed by a predetermined reference amount;

c) pulse producing means for comparing said sampled and held value of said output electrical quantity in said sample and hold means with said output electrical quantity from said converting means to produce one output electrical pulse when the difference between said sampled and held value and said output electrical quantity has reached said predetermined reference amount; and d) means for applying said output electrical pulse to said sample and hold means thereby to cause said sample and hold means to replace said sampled and held value by said output electrical quantity then produced by said converting means.

(2) The system of the second construction comprises the component means a), b), c) and d) of the system of the first construction, with said converting means a) comprising a plurality of converters operable in response to the same physical quantity in different, continuous ranges to convert the physical quantity to a corresponding output electrical quantity; and further includes comparing means for comparing said output electrical quantity from each of said converters with a predetermined limit value, and selecting means for switching from that one of said converters whose output electrical quantity has reached said limit value to the next one of said converters whose output electrical quantity has not yet reached said limit value so as to select the output electrical pulse from said pulse producing means caused by said output electrical quantity from said next one of said converters.

(3) The system of the third construction comprises the means a), b), c) and d) of the system of the first construction, with said pulse producing means c) being so constructed as to produce one pulse each time the difference between said sampled and held value of said output electrical quantity in said sample and hold means b) and said output electrical quantity changing in both increasing and decreasing directions has reached said reference amount.

(4) The system of the fourth construction comprises the component means of the system of the second construction, with said pulse producing means c) being so constructed as to produce one pulse each each time the difference between said sampled and held value of said output electrical quantity in said sample and hold means b) and said output electrical quantity changing in both increasing and decreasing directions has reached said reference amount.

In the system of the first construction, as a physical quantity, say, the position of an object changes, the converting means a) operates in response to the change to apply a corresponding electrical quantity, say, a voltage to the sample and hold means b) to be held therein. Each time the level of the input voltage to the sample and hold means has changed by a predetermined reference value, the sample and hold means has its held voltage level replaced by a new level of the voltage then applied thereto, so that the level of the voltage held by the sample and hold means changes stepwise. The pulse producing means c) compares the level of the voltage held by the sample and hold means with the level of the voltage from the converting means and produces one output pulse each time the difference between the two voltage levels has reached a predetermined reference value. The output pulse is instantly applied to the sample and hold means, which replaces the level of the then held voltage by that of the voltage then applied thereto. The output pulse is also taken out at an output terminal of the system. As the position of the object changes, the above operation is repeated so that a series of pulses appear at the output terminal. The pulses may be counted by an outside pulse counter, so that the position or the amount of displacement of the object can be represented by the counted value.

The system of the second construction comprises a plurality, say, two subsystems of the first construction so combined in parallel that when the physical quantity being dealt with changes beyond the range covered by the converting means of one of the two subsystems, the operation is taken over by the other subsystem covering an adjacent range, so that the continuity of operation is ensured.

The system of the third construction is adapted for use in a situation that a physical quantity being dealt with changes in both positive and negative directions, that is, increases and dicreases. If the pulses produced by the pulse producing means when displacements occur in the positive and negative directions are summed, it is possible to know the sum of the displacements in the two directions. If the pulses produced by the pulse producing means when a displacement occurs in the negative direction are subtracted from the pulses produced by the pulse producing means when a displacement occurs in the positive direction, it is possible to know the displacement from a reference position.

The system of the fourth construction is able to perform the operations of the systems of the second and the third constructions.

In any of the above systems of the first to fourth constructions, by changing the predetermined reference value for the output electrical quantity of the converting means it is possible to change the density of the ouput pulses from the pulse producing means and consequently the resolution of the system.

If a physical quantity being dealt with changes and consequently the output electrical quantity of the converting means changes at a speed lower than a predetermined value, such a change should be considered not as an intended change but as an inadvertent change, to which latter the system should remain insensitive. To this end, the sample and hold means is so arranged that the value held therein is continuously changed so as to approach the output electrical quantity of the converting means applied to the sample and hold means, thereby to prevent the difference between the held value of the sample and hold means and the output electrical quantity from the converting means from reaching the reference value and consequently to prevent the pulse producing means from producing output pulses. In other words, the system is kept insensitive to slow changes of the physical quantity being dealt with.

There are various physical quantities which can be dealt with by the systems of the invention, such as position, angle, temperature, humidity, weight, velocity, acceleration, brightness, transmittance and other optical quantities, radiation density, electric field strength, flux density, concentrations, pH, and ratios of components of chemical solutions, transparency, flow rate, pressure, frequency, etc.

In the following description displacement will be taken as an example.

As the means for converting a displacement to a corresponding electrical quantity a potentiometer can be used conveniently. Any other devices for converting changes in position or angle to corresponding electrical signals can also be used. Suitable elements or devices for converting other physical quantities to corresponding electrical quantities can also be used.

In the prior art encoders, the graduation is digital, with marks formed at fixed, regular intervals. The systems of the present invention can have a desired graduation suitable for a particular use, with a desired amount of displacement for one output pulse. In other words, the graduation of the systems of the invention is analog.

The rotary type encoders of the invention can have a pulse density of, say, 100, 200 or 500 pulses per revolution. The density may also be 101, 102, 103, 499 or 501 pulses per revolution. The number of pulses per revolution may include a fraction, such as 345 pulses for two revolutions.

In accordance with the invention, it is possible to have a desired pulse density per unit amount of displacement. The instrument of the invention may be manufactured without graduation to indicate the positions at which a pulse is produced, so that later it may be set to a desired pulse density suitable for a particular application. As a result, it is possible to freely change the pulse density during use of the instrument.

If the instrument has to be moved a long distance to reach an objective point, at first it is moved over most of the distance with the pulse density set to a high value, and as the instrument approaches the objective point, the pulse density is reduced, and finally the instrument locates the objective point with the lowest pulse density. In this manner, operation of the instrument of the invention can be effected more quickly and smoothly than the conventional instrument with a fixed pulse density.

In accordance with the invention, it is possible to have a physical quantity converted to another physical quantity and detect the quantity by means of a suitable detector to provide a corresponding pulse train.

Two or more systems of the invention may be combined to deal with two- or three-dimensional displacement.

PREFERRED EMBODIMENTS OF THE INVENTION

Figure 1:
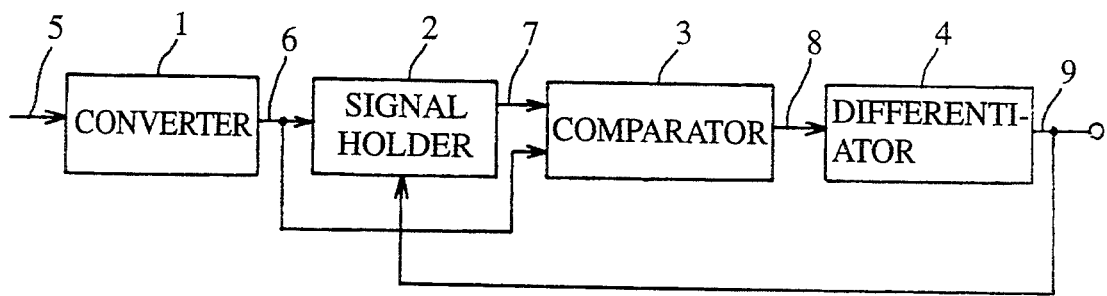
FIG. 1 is a block diagram of a system of the first construction of the invention.

Referring to the drawings, first to FIG. 1, which shows a system of the first construction of the invention adapted for displacement in a single direction, there are shown a converter 1, a sample and hold circuit (to be referred to as a signal holder or holder hereinafter) 2, a comparator 3 and a differentiator 4. The converter 1 can be a potentiometer of a known rotary type, which converts an amount 5 of displacement to a corresponding voltage, which is produced as an output signal (to be referred as a displacement signal) 6 to be applied to both the signal holder 2 and the comparator 3.

The signal holder 2 holds the level of the displacement signal 6 (to be referred to as the held value) at the time the output pulse 9 from the differentiator 4 is applied to the holder 2, and outputs a held value signal 7 to be applied to the comparator 3.

The comparator 3 compares the displacement signal 6 from the converter 1 with the held value signal 7 from the signal holder 2, and provides an output pulse signal 8 only when the displacement signal 6 has exceeded the held value signal 7 by a predetermined voltage (to be referred to as the reference amount or value) R.

The output pulse signal 8 from the comparator 3 is applied to the differentiator 4, which produces an output pulse signal 9 to be applied to an outside pulse counter, not shown, and also to the signal holder 2 as a timing signal to cause the level of the held value signal 7 then held by the signal holder 2 to be replaced by the level of the displacement signal 6 being applied to the signal holder 2 at that time.

Figure 2:
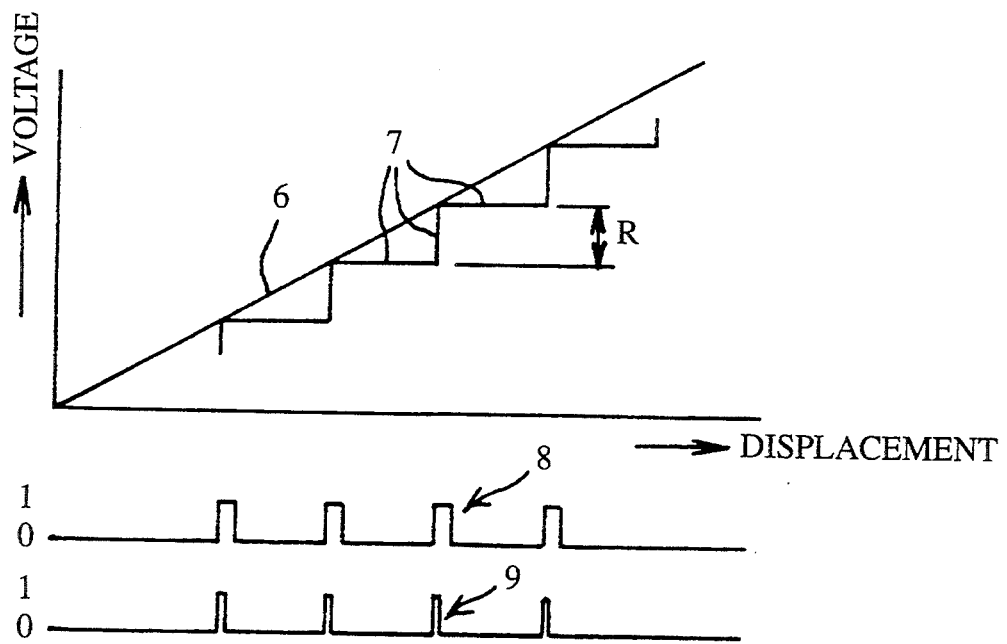
FIG. 2 is a graph for explanation of the principle of the invention.

The above operation of the system is graphically shown in FIG. 2. Upon the displacement signal 6 from the converter 1 increasing and reaching a predetermined voltage level (the reference value) R, say, 1 millivolt higher than the held value signal 7 of the signal holder 2, the comparator 3 produces an output pulse signal 8. In other words, the output signal 8 from the comparator 3 becomes logic "1". The differentiator 4 shapes the waveform of the signal 8 and produces a pulse signal 9. The pulse signal 9 causes the signal holder 2 to replace the voltage (the held value signal) 7 it has been holding until then by the input voltage (the displacement signal) 6 at that time. In other words, the input voltage at that time becomes a new held value of the signal holder 2, whereupon the difference between the levels of the signals 6 and 7 becomes zero, rendering the set voltage difference zero, so that the signal 8 changes from logic "1" to "0".

As the displacement signal 6 increases, the above operation is repeated with the result that the differentiator 4 produces a series of pulses 9 the number of which corresponds to the amount of displacement. The pulses 9 may be counted by a pulse counter, and the counted value may be indicated as an amount of displacement on an indicator.

Figure 18A:
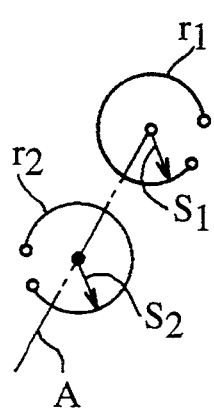
FIGS. 18(a) (b) (c) and (d) schematically show the converters used in the systems of the invention.
Figure 18B:
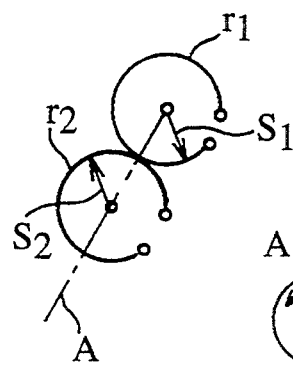
Figure 18C:
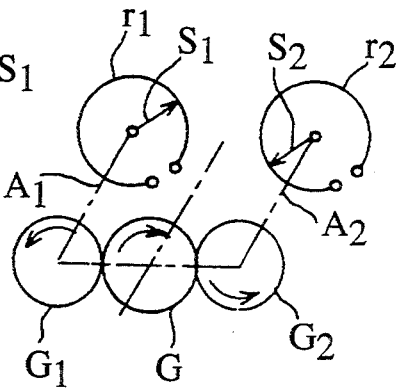
Figure 18D:
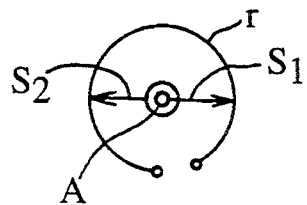

In the system of FIG. 1, since a single converter 1 is employed, the diameter of the resistor of a rotary type potentiometer or the length of the resistor of a linear type potentiometer sets a limit to the effective range of displacement. The range may be widened by employing a plurality of converters. A typical rotary type potentiometer has an effective measuring angular range of 250° to 350°. As shown in FIG. 18(a), two rotary type potentiometers $r_1$ and $r_2$ may be aligned on a common axis A and displaced angularly about 180° from each other, with their respective sliders $S_1$ and $S_2$ fixed on the common axis A at the same angular position. As shown in FIG. 18(b), two rotary type potentiometers $r_1$ and $r_2$ may also be aligned on a common axis A at the same angular position, with their resepctive sliders $S_1$ and $S_2$ fixed on the axis angularly displaced 180° from each other. It is further possible to arrange two rotary type potentiometers $r_1$ and $r_2$ side by side on a pair of parallel axes $A_1$ and $A_2$, with their sliders $S_1$ and $S_2$ fixed to the axes $A_1$ and $A_2$, respectively, 180° apart from each other, as shown in FIG. 18(c). A pair of gears $G_1$ and $G_2$ are fixed to the axes $A_1$ and $A_2$, respectively, with a pinion gear G meshing with the gears $G_1$ and $G_2$, so that rotation of the gear G causes simultaneous rotation of the gears $G_1$ and $G_2$. FIG. 18(d) shows a different embodiment in which a single circular resistor r is provided with a pair of sliders $S_1$ and $S_2$ fixed to an axis A concentric with the circle of the resistor and angularly displaced 180° from each other and electrically insulated from each other.

Figure 4A:
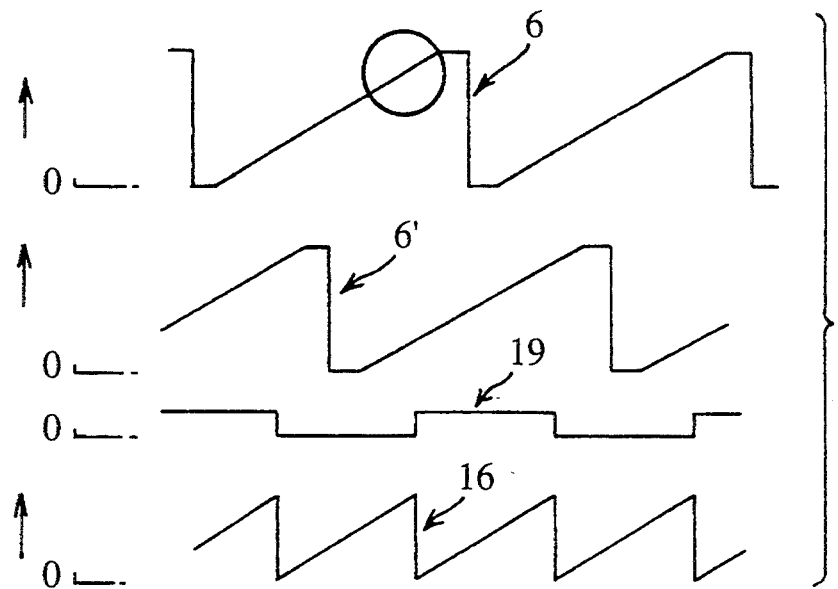
FIGS. 4(a) and 4(b) are graphs for explanation of the operation of the system of the second construction shown in FIG. 3.

With the above-mentioned converters, since the outputs taken out of the sliders $S_1$ and $S_2$, that is, the displacement signals 6 and 6' from the converters 1 and 1' have their phases displaced 180° from each other, as shown in FIG. 4a, it is possible to arrange so that before the output from one of the potentiometers $r_1$ and $r_2$ goes out of the effective range, the output from the other enters the range. If the circular resistors of the potentiometers have an effective angular range smaller than that abovementioned, three or more potentiometers may be used to have a continuous range of 360°.

When linear type potentiometers are to be used, by arranging as many of them as are required in such a manner that the end portions of each adjacent two converting elements overlap each other and switching from one of the elements to a succeeding one, it is possible to continuously cover the whole distance of displacement to be measured.

If linear motion is converted to rotary motion by suitable means such as gears, a rotary encoder may be used instead of a linear encoder to measure linear displacement.

Figure 3:
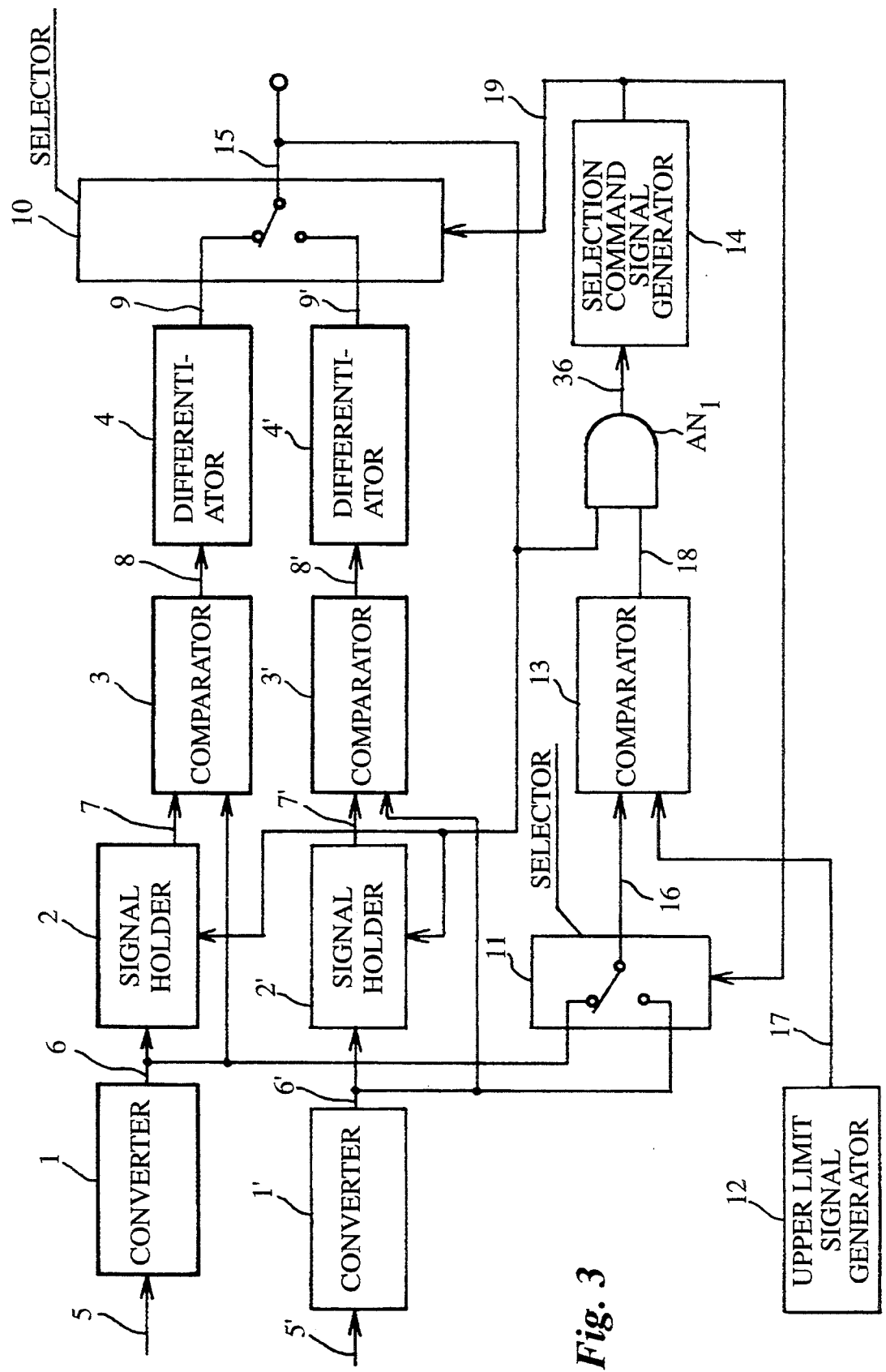
FIG. 3 is a block diagram of a system of the second construction of the invention.

FIG. 3 shows a system of the second construction of the invention, in which two such converters as mentioned above are used. The system of FIG. 3 comprises a first and a second subsystems and a control circuit. The first subsystem comprises a converter 1, a signal holder 2, a comparator 3 and a differentiator 4. These circuit components and their input and output signals 5, 6, 7, 8 and 9 are the same as the corresponding components and signals in the system of FIG. 1. Similarly, the second subsystem comprises a converter 1', a signal holder 2', a comparator 3' and a differentiator 4'. These circuit components and their input and output signals 5', 6', 7', 8' and 9' are the same as the corresponding components and signals in the above-mentioned first subsystem except that the phases of the signals 6', 7', 8' and 9' are displaced 180° from those of the corresponding signals 6, 7, 8 and 9 in the first subsystem, respectively. The operations of the first and second subsystems are substantially the same as that of the system in FIG. 1, so that no explanation will be given.

The control circuit comprises a first and a second selector 10 and 11 for selecting one of the first and second subsystems, an upper limit signal generator 12, a comparator 13, an AND element $AN_1$ and a selection command signal generator 14 in the form of a flip-flop.

The selector 10 selects either one of the output signal 9 of the differentiator 4 of the first subsystem and the output signal 9' of the differentiator 4' of the second subsystem depending upon whether the output signal (that is, the selection command signal) 19 of the selection signal generator 14 is logic "1" or "0", and produces a corresponding output signal 15. In the system of FIG. 1, the held value of the signal holder 1, that is, the level of the displacement signal 6 held therein is renewed upon triggering signal holder 2 by the output signal 9 of the differentiator 4. In the system of FIG. 3, the held values of the signal holders 2 and 2' of the first and second subsystems are renewed by the output 15 of the selector 10, that is, the output signal 9 or 9' of the differentiator 4 or 4'.

In the control circuit, the selector 11 selects the displacement signal 6 or 6' of that one of the first and second subsystems which the selector 10 selects in accordance with the output signal 19 of the selection command signal generator 14. The upper limit signal generator 12 applies to the comparator 13 an output signal (upper limit signal) 17 having a level corresponding to that of the displacement signal 6 or 6' which corresponds to a displacement a little before the effective operation range of the converter 1 or 1' is exceeded (that is, to the upper limit of the effective operation range of the converter 1 or 1').

Figure 4B:
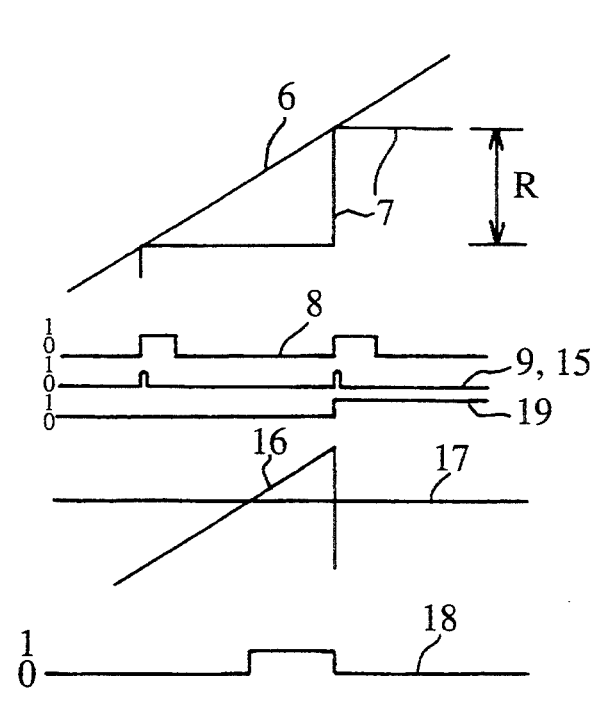

The comparator 13 compares the output signal 16 from the selector 11 with the upper limit signal 17, and when the signal 16 has reached the level of the signal 17 as shown in FIG. 4b, the comparator 13 applies an output signal (a logic "1" signal) 18 to one of the two inputs of the AND element AN, a predetermined value before the effective operation range of the converter 1 or 1' is exceeded.

With the logic "1" signal 18 being applied to one of the two inputs of the AND element $AN_1$, when the next output pulse signal 15 of the selector 10 is applied to the other input of the AND element $AN_1$, it produces an output signal 36 to be applied to the selection command signal generator 14, which recognizes that the upper limit of the effective operation range of the then operating subsystem, say, the first one (1–4) has been reached and reverses the logic state of its output signal 19, whereupon the selectors 10 and 11 operate to select the other, say, second subsystem (1'–4'), so that the output signal 9' of the differentiator 4' becomes the output 15 of the selector 10.

In operation, as displacement increases, the first and second subsystems alternatively and alternately operate, so that the signal 9 or 9' is produced as the output pulse signal 15. Since the signal 9 or 9' is produced in the same manner as in the system of FIG. 1. no explanation will be given in this respect, but the operation of switching from the first to the second subsystem when the effective operation range of the first subsystem has been exceeded will be explained in further detail with reference to FIGS. 3, 4a and 4b. FIG. 4b is an enlarged view of the encircled portion of FIG. 4a.

The displacement signal 6 of the first subsystem selected by the selection command signal (a logic "0"

signal) 19 from the selection command signal generator 14 is applied as the signal 16 to the comparator 13 through the selector 11. When the level of the input signal 16 has reached that of the upper limit signal 17 from the upper limit signal generator 12, the comparator 13 produces an output signal 18 indicating that the upper limit of the effective operation range of the converter 1 has been reached, and applies the signal 18 to one input of the AND element $AN_1$. As the displacement further increases, the displacement signal 6 increases until the next pulse signal 9 is produced, whereupon the selector 10 which is now selecting the first subsystem (1–4) outputs the signal 9 as the signal 15 to be applied to the other input of the AND element $AN_1$. Now both inputs of the AND element $AN_1$ are "1", so that the AND element $AN_1$ produces an output 36, which causes the selection command signal generator 14 to change its output from "0" to "1" thereby to switch the selectors 10 and 11 from the first to the second subsystem, which continues its operation with the displacement signal 6'.

While the first subsystem was operating, the output pulse signal 15 was applied to the signal holder 2' as well as the signal holder 2 to renew the held value of the signal holder 2', so that the continuity of the output signal 15 is maintained despite the switching from one of the two subsystems to the other.

Figure 5:
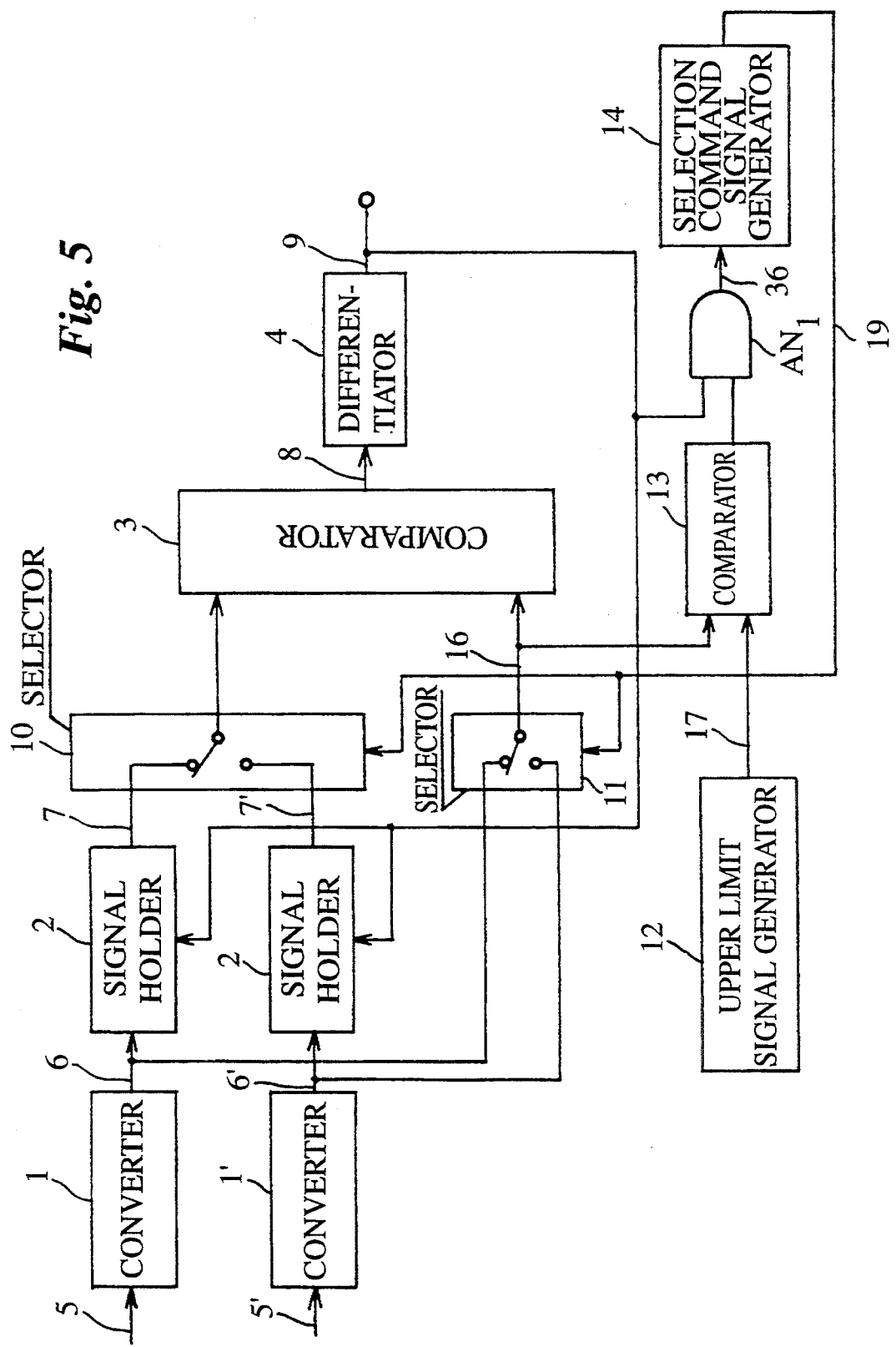
FIG. 5 is a block diagram of a modified form of the system of the second construction of the invention.

FIG. 5 shows a first modification of the system of FIG. 3. In the arrangement of FIG. 3 each of the first and second subsystems includes a comparator 3, 3' and a differentiator 4, 4'. In the arrangement of FIG. 5 a selector 10 is connected to the outputs of the signal holders 2 and 2' for simplification of the circuit design with a single comparator 3 and a single differentiator 4 for both the first and second subsystems. The operation of the system of FIG. 5 will be easily understood from the above description of the system of FIG. 3, so that no explanation will be given.

Figure 6:
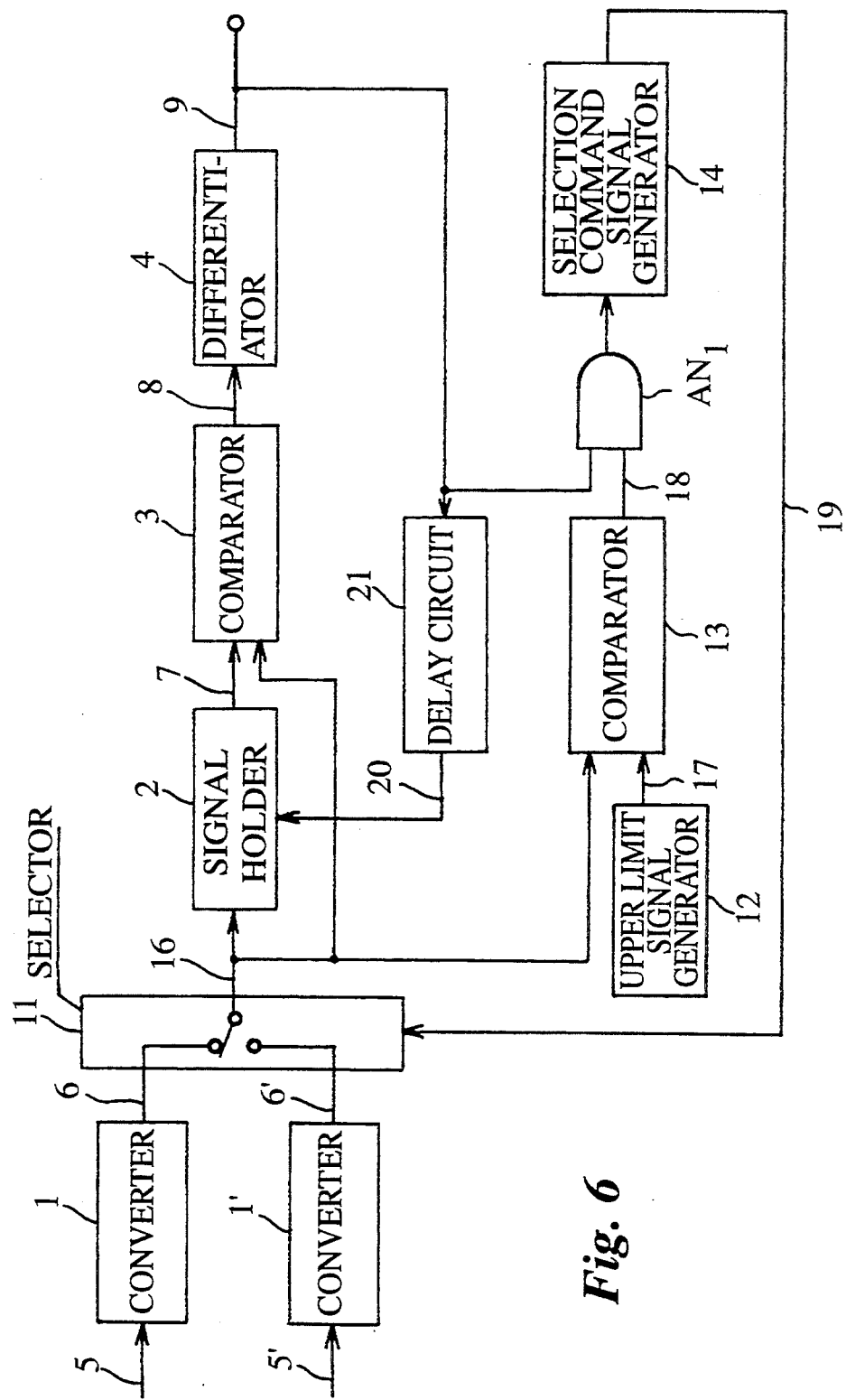
FIG. 6 is a block diagram of another modified form of the system of the second construction of the invention.

FIG. 6 shows a second modification of the system of FIG. 3. In the system of FIG. 6 a selector 11 is connected to the outputs of the converters 1 and 1' for simplification of the circuit design with a single signal holder 2, a single comparator 3 and a single differentiator 4 for the first and second subsystems. In the system of FIG. 6, the output 9 from the differentiator 4 is applied through a delay circuit 21 to the signal holder 2 to renew the signal held by the holder 2.

In the systems of FIGS. 3 and 5, the held values of the holders 2 and 2' are renewed the instant the output 9 (15) is produced. In the system of FIG. 6, the delay circuit 21 applies the outut signal 9 from the differentiator 4 as a delayed signal 20 to the signal holder 2 for renewal of the held value thereof. This arrangement ensures that when the output signal 19 from the selection command signal generator 14 causes the selector 11 to switch from one of the converters 1 and 1' to the other, only after the displacement signal 6 or 6' from the newly selected converter 1 or 1' is applied to the signal holder 2 to be held therein as a new held signal, the comparator 3 compares the newly held level of the displacement signal 6 or 6' and the subsequent level thereof. If the output pulse 9 of the differentiator 4 were applied to the signal holder 2 without passing through the delay circuit 21 to renew the level of the displacement signal held by the holder 2 from, say, converter 1 and the selector 11 were switched to select the other converter, say, 1', the then renewed signal held by the holder 2 would have the high level of the displacement signal 6 of the previous converter 1 before the switching from the converter 1 to the converter 1', so that the low level of the signal 6' of the newly selected converter 1' would be compared with the high level of the signal 6 of the previous converter 1. Under the condition, even when the displacement signal 6' changes by the reference value, the level of the signal 6' would not reach the high level of the signal 6 now held by the holder 2, so that the differentiator 4 would not produce an output pulse 9.

in the system of FIG. 6, due to the delay circuit 21 it takes a longer time to have the held signal level of the holder 2 renewed, with resulting reduction of the accuracy of production of a pulse train. The disadvantage, however, is offset by simplification of the whole circuit arrangement.

Figure 7:
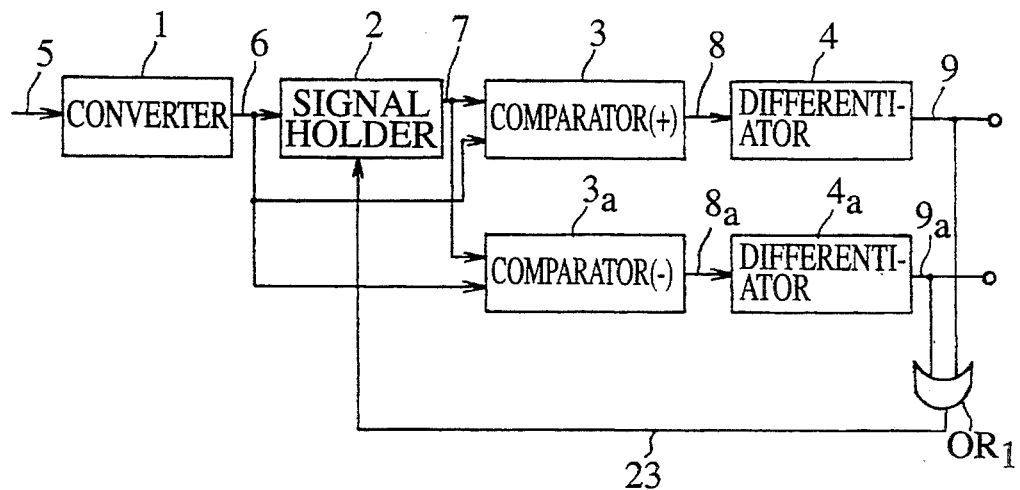
FIG. 7 is a block diagram of a system of the third construction of the invention.

The above systems are adapted for increasing displacement. FIG. 7 shows a system of the invention adapted for displacements both increasing and decreasing. The system of FIG. 7 is a modification of the embodiment of FIG. 1 so arranged as to be able to operate both when displacement increases and when it decreases. In FIG. 7 the same reference numerals as in FIG. 1 designate corresponding components, which operate in the same manner as in FIG. 1, and those components which operate as displacement decreases and the signals then produced by the components are designated by the same reference numerals suffixed with a as those corresponding components which operate as displacement increases and the signals then produced by the components.

In FIG. 7, in addition to the comparator 3, another comparator 3a is provided to compare the displacement signal 6 from the converter 1 with the held value signal 7 from the signal holder 2. When the displacement signal 6 has decreased by a predetermined voltage as compared with the held value signal 7, or when the difference between the signals 6 and 7 has reached a predetermined reference value R, the comparator 3a produces an output signal 8a, which a differentiator 4a receives to output a pulse signal 9a. An OR element $OR_1$ has its two inputs connected to the outputs of the differentiators 4 and 4a. When the OR element $OR_1$ receives the output signal 9 or 9a, it applies an output signal 23 to the signal holder 2 to renew the held value.

Figure 8:
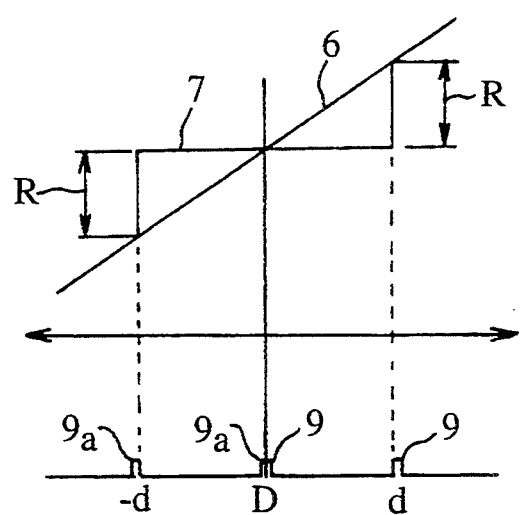
FIG. 8 is a graph for explanation of the operation of the system of the third construction of the invention.

The operation of the system of FIG. 7 will now be described with reference to FIG. 8 as well as FIG. 7. Regardless of whether displacement is increasing or decreasing, the signal holder 2 holds the level of the displacement signal 6 which corresponds to the position D of displacement when the previous pulse 9 or 9a was produced. When the comparator 3 or 3a has detected the increase or decrease of the displacement signal 6 which corresponds to a predetermined voltage difference (reference value) R, the comparator produces an output 8 or 8a at that position d or −d of displacement, so that the differentiator 4 or 4a produces an output pulse 9 or 9a which is applied to a pulse counter, not shown, as well as the OR element $OR_1$.

Figure 9:
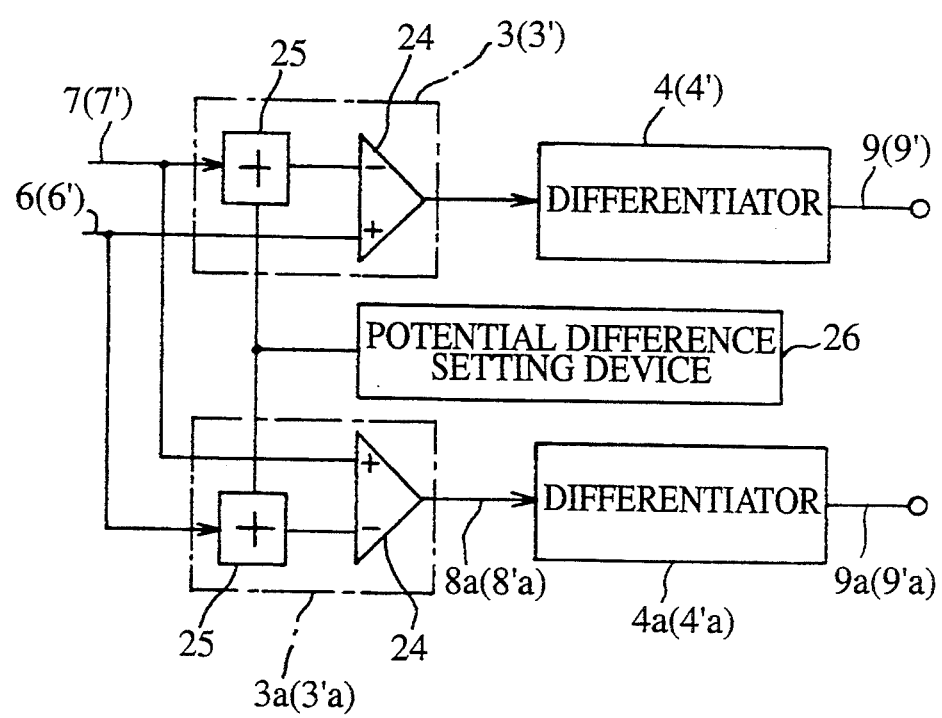
FIG. 9 is a block diagram of two comparators having a single potential difference setting device in common.

In order to provide the comparators 3 and 3a with an equal reference value R, a single device 26 for setting a potential difference (reference value) may be connected to both comparators 3 and 3a as shown in FIG. 9.

Figure 10:
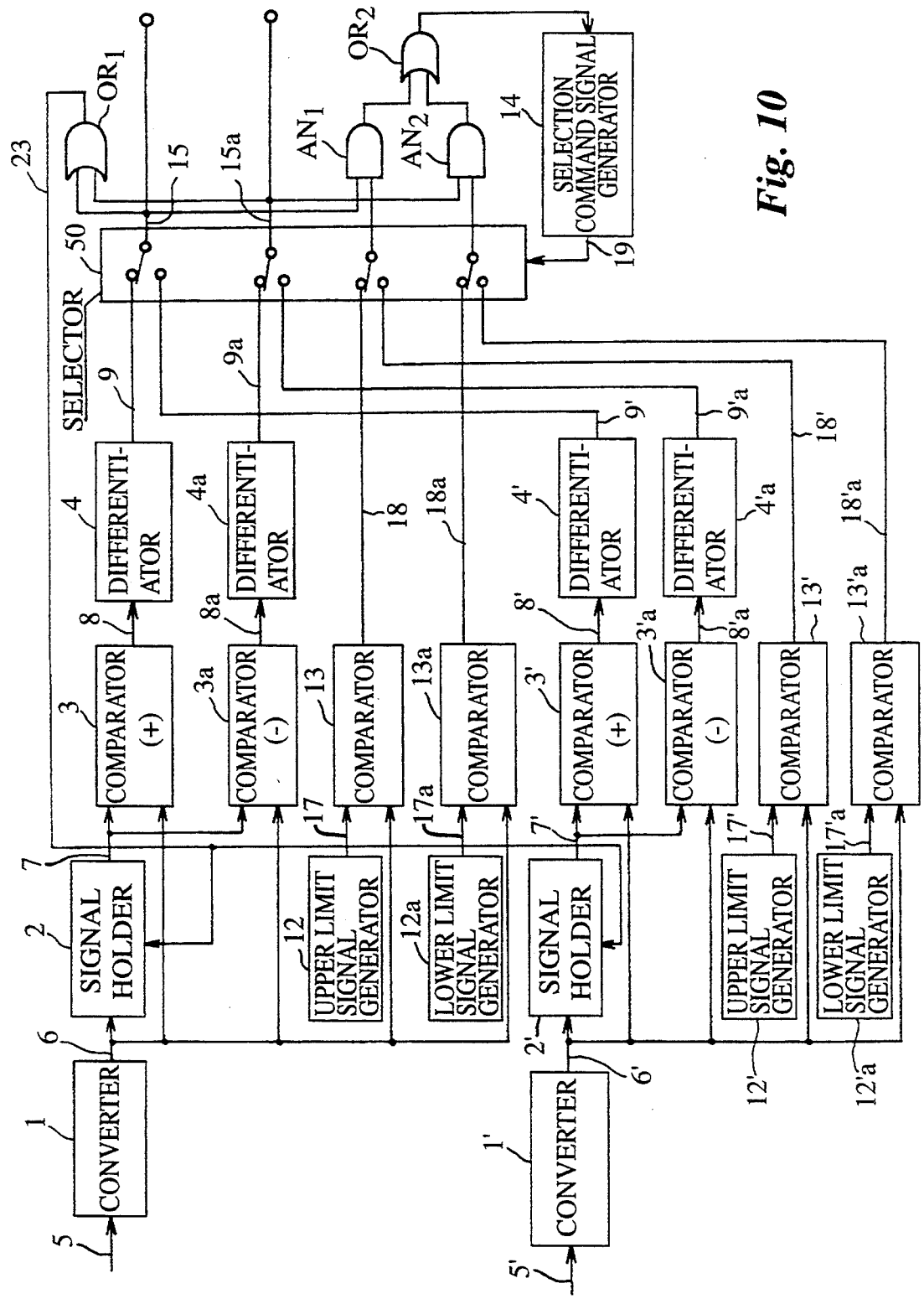
FIG. 10 is a block diagram of a system of the fourth construction of the invention.

FIG. 10 shows a system of the fourth construction of the invention having the functions of the systems of FIGS. 3 and 7. In particular, the system of FIG. 10 comprises two subsystems each of which is shown in FIG. 7 and operable in response to displacement in opposite directions, and means for enabling alternate operation of the two subsystems. When the displacement signal 6 or 6' reaches its upper or lower limit, switching is conducted from that one of the two subsystems which has been operating until then to the other.

The signals from the corresponding components in the two subsystems are 180° out of phase from each other and are designated by the same reference numerals with and without a prime ('). Those output signals which are produced as displacement decreases are designated by the same reference numerals suffixed with a as those output signals which are produced as displacement increases. An AND element $AN_2$ equivalent to the AND element $AN_1$ receives the output signal 15a from the differentiator 4a or 4'a and the output signal 18a or 18'a from the comparator 13a or 13'a through a selector 50 and applies its output to a selection command signal generator 14 through an OR element $OR_2$.

The operation of the system of FIG. 10 is a combination of the operations of the systems shown in FIGS. 3 and 7 and will be easily understood from the description of their respective operations, so that a simple description will suffice.

The selector 50 produces an output signal 15 as the amount 5 or 5' of displacement increases and an output signal 15a as the amount of displacement decreases. As displacement increases or decreases, the output signal 6 or 6' from the converter 1 or 1' increases or decreases to the upper or lower limit level, whereupon the selection command signal generator 14 produces a selection command signal 19 to cause the selector 50 to switch from the then operating one of the two subsystems to the other.

Figure 11:
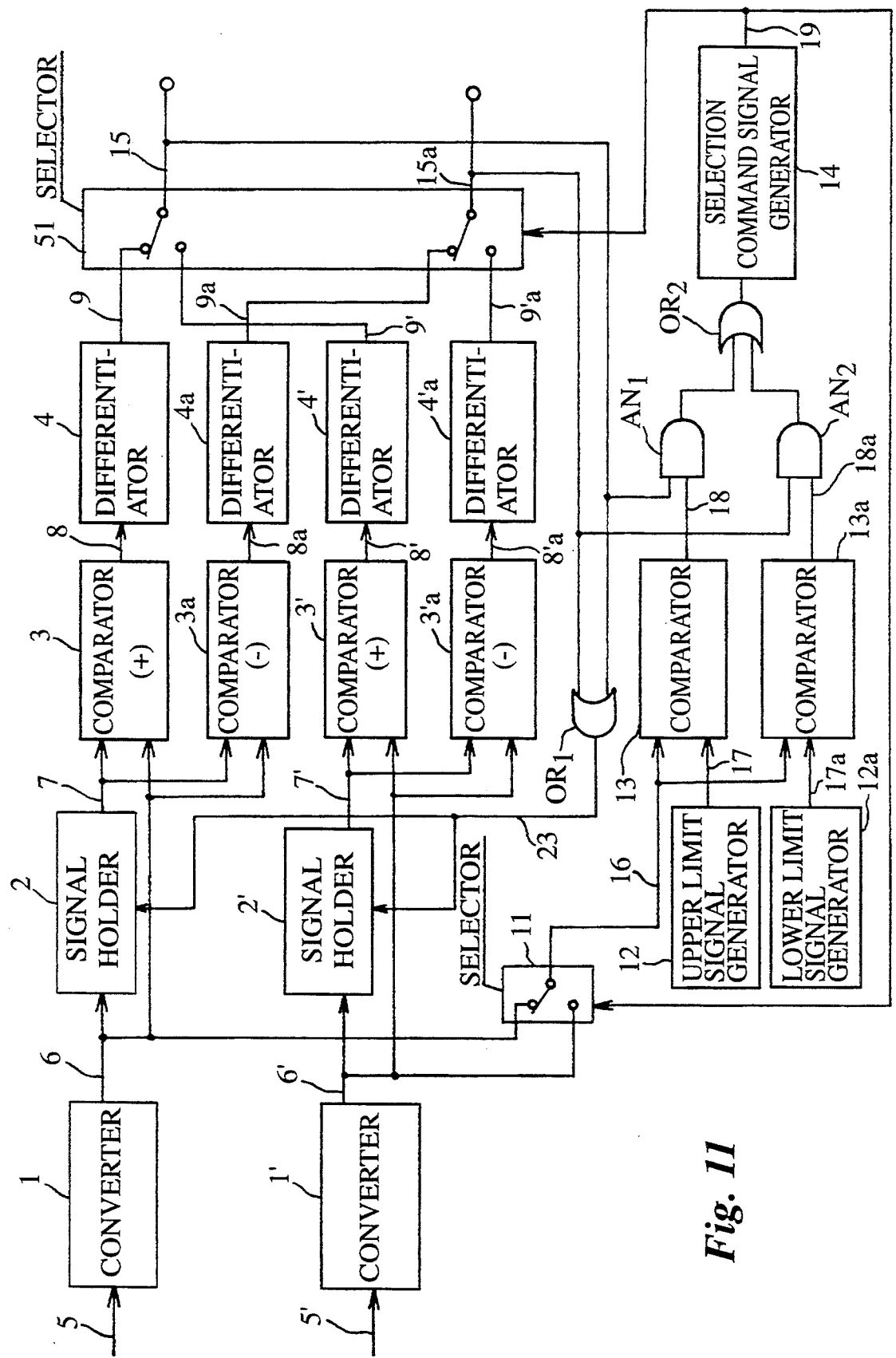
FIG. 11 is a block diagram of a modified form of the system of the fourth construction of the invention.

FIG. 11 shows a first modification of the system of FIG. 10. In FIG. 11, there is provided a selector 11, through which the outputs 6 and 6' of the converters 1 and 1' are applied to the comparators 13 and 13a, so that the comparators 13' and 13'a in FIG. 10 may be eliminated. The selector 51 in FIG. 11 corresponds to the selector 50 in FIG. 10 except that the outputs 18 and 18a of the comparators 13 and 13a are applied directly to the AND elements $AN_1$ and $AN_2$, respectively, without passing through the selector 51. The operation of the system of FIG. 11 can be easily understood from the description of the system of FIG. 10, so that no explanation will be given.

Figure 12:
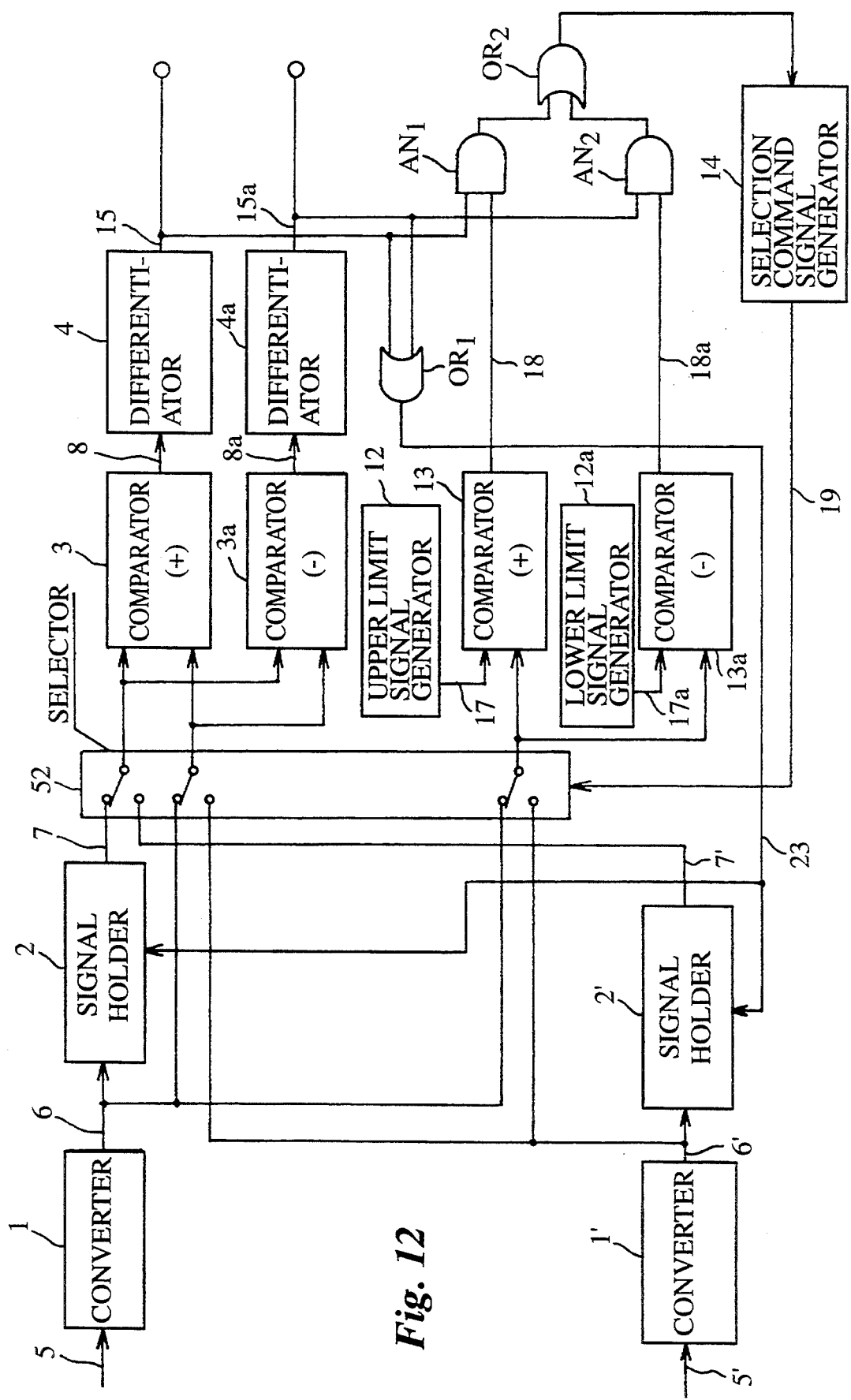
FIG. 12 is a block diagram of another modified form of the system of the fourth construction of the invention.

FIG. 12 shows a second modification of the system of FIG. 10. In FIG. 12, the comparators 3', 3'a, 13' and 13'a, and the differentiators 4' and 4'a in FIG. 10 are eliminated, and the outputs (held value signals) 7 and 7' from the signal holders 2 and 2' are applied to the comparators 3 and 3a through a selector 52, which includes the function of the selector 11 in FIG. 11. The operation of the system of FIG. 12 can also be easily understood, so that no explanation will be given.

Figure 13:
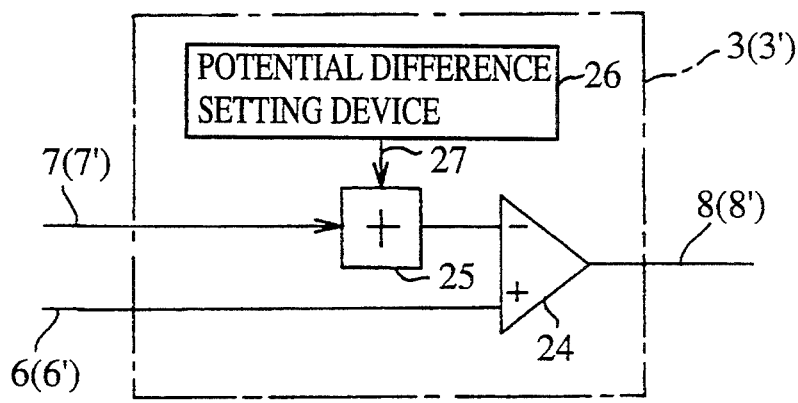
FIG. 13 is a block diagram of a comparator used in the systems of the invention.

In the previous embodiments, the interval between output pulses 9 (9a, 9', 9'a), that is, the amount of displacement (or the reference value R) that occurs from the time at which the previous pulse was produced to the time at which the present pulse has been produced is set to a predetermined value, so that the systems have a fixed pulse density or resolution. By making the above-mentioned interval variable it is possible to have a variable pulse density. To this end, each of the comparators 3, 3', 3a, and 3'a may comprise a comparator 24, an adder 25 and a device 26 for setting a potential difference (the reference value R), as shown in FIGS. 9 and 13.

In the system where the comaprators 3 (3') and 3a (3'a) are provided for displacement in both increasing and decreasing directions, a common reference value setting device 26 is provided for both the comparators 3 (3') and 3a (3'a), as shown in FIG. 9 in order that there may not be a difference in sensitivity between displacement in increasing and decreasing directions. In either case, in order to make the sensitivity variable, the device 26 must have its output voltage variable. Various types of variable reference value setting devices may be used, such as a potentiometer in which the set reference value or potential difference is varied manually or in response to changes of exterior conditions, or a device in which a desired potential difference can be set with a D/A converter controlled by an exterior electronic device or computer.

In the above arrangements, the signal holders 2 and 2' have the function of accurately maintaining the level of the voltage corresponding to the displacement when the previous output pulse (9', 9a, 9a', 15 or 15a) was produced until the next pulse is produced. In this type of encoder, an unintended displacement sometimes occurs, and it is desirable that the instrument remains insensitive to such unintended displacements. Such displacements to which the instrument should remain insensitive occurs usually at a low speed.

Figure 14:
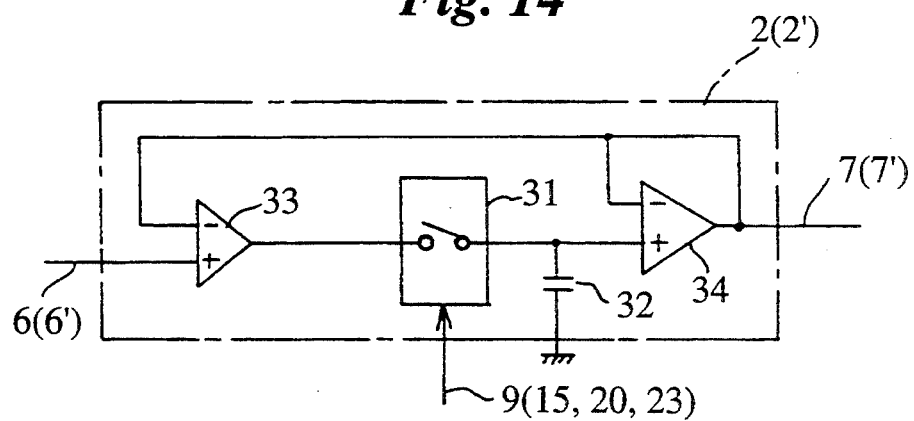
FIG. 14 is a block diagram of an example of the sample and hold circuit used in the systems of the invention.

In accordance with the invention, it is possible to make the instrument insensitive to displacements occurring at a low speed by using as each of the signal holders 2 and 2' a sample and hold circuit (to be referred to as the S/H circuit hereinafter) composed of a capacitor 32, operational amplifiers 33 and 34 and a switching circuit 31, as shown in FIG. 14. The switching circuit 31 usually is an electronic circuit. So long as there is no renewal command signal 9 (15, 20, 23) applied to the signal holder 2 (2'), the switch 31 remains open, so that the terminal voltage of the capacitor 32 is taken out through the operational amplifier 34 as an output signal 7 (7'). When the signal 9 (15, 20, 23) is applied to the switch 31, the switch 31 is closed, so that the input displacement signal 6 (6') from the converter 1 (1') is applied to the capacitor 32 through the operational amplifier 33 and the closed switch 31 to charge the capacitor 32, whereupon the level of the displacement signal 6 (6') is held by the holder 2 (2') and the terminal voltage of the capacitor 32 becomes the output held value signal 7 (7') of the holder 2 (2'). The operation, which is called sampling, is graphically shown in FIG. 16. The renewal command signal 9 (15, 20, 23), which is the output from the differentiator 4 (4a', 4', 4'a), has a pulse width so negligibly small as compared with the interval between the output pulses 9, so that the sampling operation is completed instantly and does not affect the operation of the whole system.

In the S/H circuit of FIG. 14, the switch 31 is either completely open or completely closed.

Figure 16:
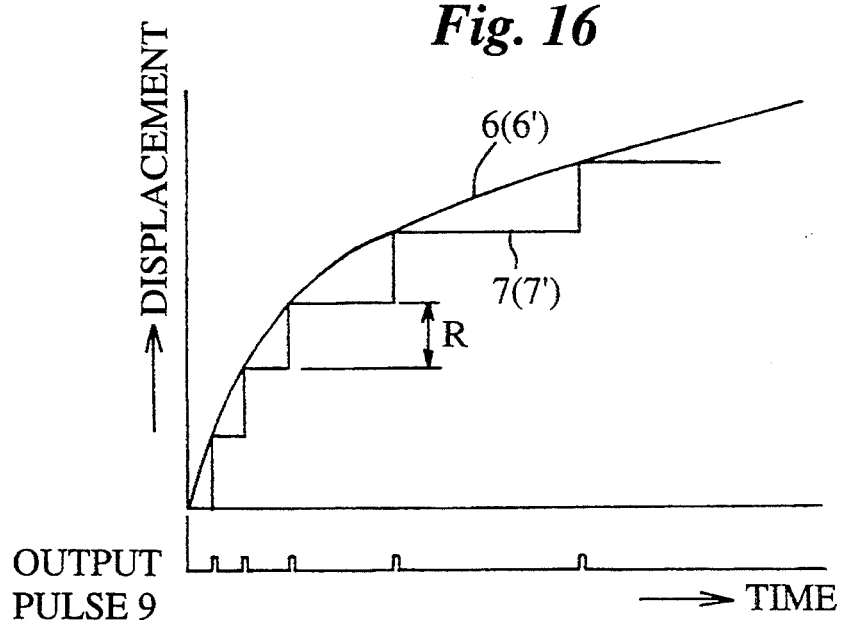
FIG. 16 is a graph for explanation of the circuit shown in FIG. 14.

FIG. 16 graphically shows the relation between the speed of displacement or the change of the displacement signal 6 (6') and the held value signal 7 (7') of the signal holder 2 (2'). Each time the difference between the signal 6 (6') which is increasing and the signal 7 (7') reaches the reference value R, an output pulse 9 is produced. As the speed of displacement, that is, the inclination of the curve 6 (6') in FIG. 16 decreases, the interval between the pulses 9 increases.

Figure 15:
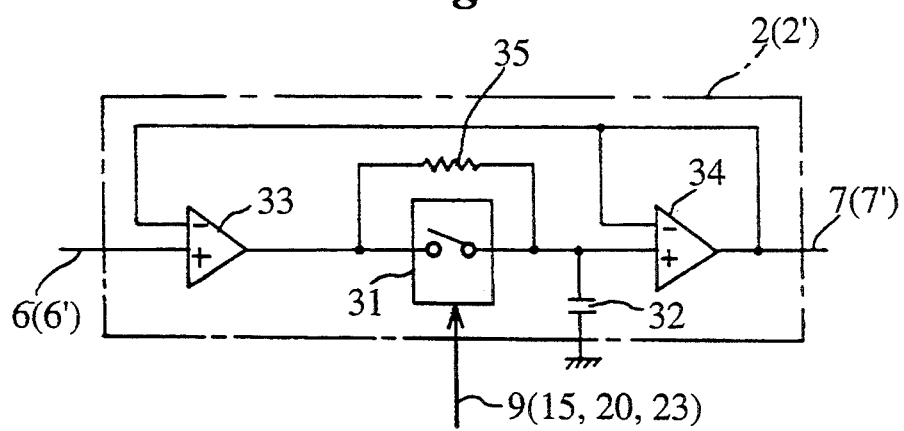
FIG. 15 is a block diagram of another example of the sample and hold circuit.

In order to make the system insensitive to displacements occurring at a low speed, a resistor 35 is connected across the switch 31 of the S/H circuit constituting the signal holder 2 (2'), as shown in FIG. 15, thereby to keep the switch 31 conducting even while it is open. The instant the switch 31 is closed, the displacement signal 6 (6') charges the capacitor 32 to the level of the input voltage (so that the held value of the signal holder 2 (2') is renewed) in a moment as in the arrangement of FIG. 14. Even while the switch 31 is open, the capacitor 32 is gradually charged through the resistor 35, so that the terminal voltage or signal 7 (7') increases as shown by the curve inclining upwardly toward the right in FIG. 17.

Figure 17:
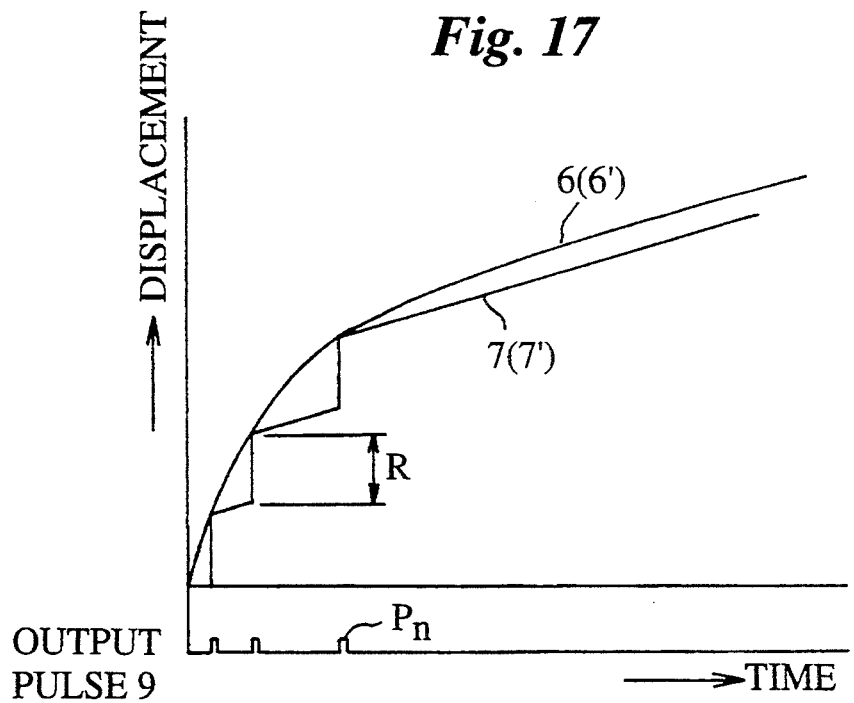
FIG. 17 is a graph for explanation of the circuit shown in FIG. 15.

Suppose that the speed of the displacement to which the system should be kept insensitive is preset to, for example, a speed that one pulse 9 is produced in every two (2) seconds by the capacitance of the capacitor 32 and the resistance of the resistor 35. The speed of displacement will be referred to as the displacement insensitive speed hereinafter. Suppose that a displacement occurs at such a speed that ten (10) pulses 9 are produced in every one second. The system operates normally, that is, the output held value signal 7 (7') from the signal holder 2 (2') gradually changes with the input displacement signal 6 (6'). Since the change of the signal 6 (6') is greater than that of the signal 7 (7'), the difference between the levels of the two signals presently reaches the reference value R, whereupon an output pulse 8 (9) is produced. The condition continues until a pulse Pn is produced as shown in FIG. 17.

Suppose that the displacement is slowed down to a speed such that one pulse 9 is produced in every five (5) seconds. Even when there has occurred a displacement from the position where the output pulse Pn was produced to a position where the next output pulse is expected to be produced, since the change (or increase) of the input displacement signal 6 (6') is accompanied by charging of the capacitor 32 through the resistor 35 at the same speed as the change of the input signal, the terminal voltage of the capacitor 32, that is, the held value signal 7 (7') of the signal holder 2 (2') with which the input displacement signal 6 (6') is to be compared changes (or increases) so as to approach the level of the input signal 6 (6') as shown at the right side of the pulse Pn in FIG. 17, and the comparator 3 (3') will not produce an output signal 8. In other words, the system remains insensitive to any displacement occurring at a low speed.

There are various changes and modifications other than the arrangements above described. For example, in the system of FIG. 10 one of the signal holders 2 an 2' may be eliminated as in the system of FIG. 6 with necessary changes to the circuitry.

In the arrangements of FIGS. 5, 6, 10, 11 and 12, two subsystems are operated alternately. Three or more subsystems may also be used.

In the illustrated embodiments the physical quantity treated by the systems is position. It is possible to treat with any other physical qunatities.

In accordance with the invention, it is possible to continuously change the pulse density or resolution of the system and set it to a value suitable for a particular application.

It is only upon occurrence of a displacement from the position where the previous output pulse was produced to a position where the next pulse is to be produced that an output pulse is produced, so that no chattering will occur.

In the conventional rotary encoder having a circular plate on which graduation marks are printed or otherwise formed fixedly, mechanical precision and accuracy are required. The invention does not require any such circular plate or graduations. Nor does it require mechanical precision or accuracy, so that the instrument of the invention is simple and easy to manufacture, and there will be no errors caused by abrasion of mechanical parts due to long or frequent use.

The apparatus of the invention can be used as a device for initially teaching movements and positions to a robot or graphical processing for inputting information about position into a computer, such as a CAD system, a mouse, a touch ball, etc. The invention can be applied to a dial for setting values in various measuring instruments, controllers, communication devices, etc.

What I claim is:

1. A method of producing electrical pulses in accordance with changes in a physical quantity, comprising the steps of:
   a) all predetermining a reference amount;
   b) converting by a first converter circuit said physical quantity changes to a corresponding electrical output;
   c) sampling and holding a quantity of said electrical output as a held value;
   d) comparing said held value and said electrical output and producing said electrical pulse each time said electrical output changes by said reference amount with respect to said held value; and
   e) replacing said held value by another electrical output quantity, as a subsequent held value, simultaneously with each said electrical pulse which is produced;
   f) repeating steps b), c), d) and e) thereby to produce electrical pulses corresponding in number to an amount of said changes of said physical quantity,
   g) counting the produced electrical pulses and
   h) changing the reference amount to a different reference amount to vary pulse density to change the resolution and returning to repetition step f).

2. The method of claim 1, and further comprising the step of:
   switching from said first to a second converter circuits when a limit of the first converter circuit is reached.

3. An apparatus for producing electrical pulses, comprising:
   a) converting means for converting changes in a physical quantity to corresponding changes in an electrical output,
   said converter means comprising first and second converter circuits, said second converter circuit having a different operating range from said first converter circuit;
   b) sample and hold means for sampling and holding a value of said electrical output as a held value each time said electrical output changes by a predetermined reference amount;
   c) pulse producing means for comparing said held value with said electrical output from said converting means and producing one electrical pulse each time a difference between said held value and said electrical output reaches said predetermined reference amount; and
   d) means for applying said electrical pulse to said sample and hold means thereby to cause said held value to be replaced by another value of said electrical output produced by said converting means with each electrical guise produced by said pulse producing means, the produced electrical pulses corresponding in number to an amount of said changes of said physical quantity, e) comparator means for coming the number of produced electrical pulses with a limit of said first converter circuit, and switching means, responsive to the comparator means, for switching from the first converter circuit to the second converter circuit.

4. The apparatus of claim 3, and further comprising: said converting means comprising a plurality of converters, each operating in response to said physical quantity in different, continuous measuring ranges and each converting said physical quantity over a corresponding measuring range to a corresponding electrical output;

means for comparing said corresponding electrical output from each of said converters with a different predetermined limit value, and selecting means for switching from each of said converters whose electrical output has reached said limit value to a next one of said converters whose electrical output has not yet reached its respective limit value to select an output electrical pulse, from said pulse producing means, caused by said electrical output from said next one of said converters.

5. The apparatus of claim 3, wherein said electrical output either one of increases or decreases according to increasing or decreasing in said physical quantity respectively, and said pulse producing means further comprises:

means for producing one pulse each time said difference between said held value and said electrical output reaches said reference amount for each of said increases or said decreases in said electrical output.

6. The apparatus of claim 4, wherein said electrical output either one of increases or decreases according to increasing or decreasing in said physical quantity respectively, and said pulse producing means further comprises:

means for producing one pulse each time said difference between said held value and said electrical output reaches said reference amount for each of said increases or said decreases in said electrical output.

7. The apparatus of claim 3, and further comprising: means for varying said predetermined reference amount when a limit of the first converter circuit is reached.

8. The apparatus of claim 4, and further comprising: means for varying said predetermined reference amount when a limit of the first converter circuit is reached.

9. The apparatus of claim 5, and further comprising: means for varying said predetermined reference amount when a limit of the first converter circuit is reached.

10. The apparatus of claim 6, and further comprising: means for varying said predetermined reference amount when a limit of the first converter circuit is reached.

11. The apparatus of claim 3, wherein said sample and hold means further comprises:

means for changing said held value as said electrical output changes, such that said held value approaches said electrical output when a speed of change of said electrical output is below a predetermined value.

12. The apparatus of claim 4, wherein said sample and hold means further comprises:

means for changing said held value as said electrical output changes, such that said held value approaches said electrical output when a speed of change of said electrical output is below a predetermined value.

13. The apparatus of claim 5, wherein said sample and hold means further comprises:

means for changing said held value as said electrical output changes, such that said held value approaches said electrical output when a speed of change of said electrical output is below a predetermined value.

14. The apparatus of claim 6, wherein said sample and hold means further comprises:

means for changing said held value as said electrical output changes, such that said held value approaches said electrical output when a speed of change of said electrical output is below a predetermined value.

15. The apparatus of claim 7, wherein said sample and hold means further comprises:

means for changing said held value as said electrical output changes, such that said held value approaches said electrical output when a speed of change of said electrical output is below a predetermined value.

16. The apparatus of claim 8, wherein said sample and hold means further comprises:

means for changing said held value as said electrical output changes, such that said held value approaches said electrical output when a speed of change of said electrical output is below a predetermined value.

17. The apparatus of claim 9, wherein said sample and hold means further comprises:

means for changing said held value as said electrical output changes, such that said held value approaches said electrical output when a speed of change of said electrical output is below a predetermined value.

18. The apparatus of claim 10, wherein said sample and hold means further comprises:

means for changing said held value as said electrical output changes, such that said held value approaches said electrical output when a speed of change of said electrical output is below a predetermined value.

19. A method of producing electrical pulses as recited in claim 2 further comprising the step of changing said held value as said electrical output changes such that said held value approaches said electrical output when a speed of change of said electrical output is below a predetermined value.

20. Apparatus for producing electrical pulses comprising;

first and second converters, each of said converters having different operating ranges, for converting changes in a physical quantity to corresponding changes in an electrical output, first and second sample and hold circuits, respectively responsive to said first and second converters, for sampling and holding respective values of respective electrical outputs as held values each time said respective electrical outputs change by respective predetermined reference amounts, first and second pulse producing circuits, respectively responsive to said first and second converters, for producing respective electrical pulse outputs, logic circuit means for logically combining said respective electrical pulse outputs, and switching means, responsive to said logic circuit means, for selectively switching between outputs of said converters.

* * * * *